US012803313B2

(12) United States Patent
Song et al.

(10) Patent No.: US 12,803,313 B2
(45) Date of Patent: Nov. 17, 2026

(54) METHOD AND APPARATUS WITH BATTERY CELL CHARGING BASED ON DEGRADATION PARAMETER OF ELECTROCHEMICAL MODEL

(71) Applicant: SAMSUNG ELECTRONICS CO., LTD., Suwon-si (KR)

(72) Inventors: Tae Won Song, Suwon-si (KR); Jinho Kim, Suwon-si (KR); Ju Wan Lim, Suwon-si (KR); Duk Jin Oh, Suwon-si (KR); Terrance Christopher Huang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 860 days.

(21) Appl. No.: 18/106,701

(22) Filed: Feb. 7, 2023

(65) Prior Publication Data

US 2024/0030733 A1 Jan. 25, 2024

(30) Foreign Application Priority Data

Jul. 22, 2022 (KR) ........................ 10-2022-0091194

(51) Int. Cl.

| | |
|---|---|
| ***H02J 7/84*** | (2026.01) |
| ***G01R 31/367*** | (2019.01) |
| ***G01R 31/392*** | (2019.01) |
| ***G01R 31/396*** | (2019.01) |
| ***H02J 7/40*** | (2026.01) |
| ***H02J 7/90*** | (2026.01) |

(52) U.S. Cl.
CPC .............. *H02J 7/84* (2026.01); *G01R 31/367* (2019.01); *G01R 31/392* (2019.01);
(Continued)

(58) Field of Classification Search
CPC .... H02J 7/005; H02J 7/00032; H02J 7/00712; G01R 31/392; G01R 31/396;
(Continued)

(56) References Cited

U.S. PATENT DOCUMENTS 11,088,558 B2 * 8/2021 Jung ................ H01M 10/0525
2013/0085696 A1 * 4/2013 Xu .......................... B60L 58/16 702/63
(Continued)

FOREIGN PATENT DOCUMENTS

KR 10-2018-0022517 A 3/2018
KR 10-2019-0045736 A 5/2019
(Continued)

*Primary Examiner* — Rexford N Barnie
(74) *Attorney, Agent, or Firm* — Sughrue Mion, PLLC

(57) ABSTRACT

A processor-implemented method with battery cell charging includes: for each degradation parameter set comprising one or more degradation parameters related to degradation, communicating with a server configured to generate and store a look-up table (LUT) comprising charge data for each index combination of the one or more degradation parameters comprised in the degradation parameter set; determining a current value of the one or more of the degradation parameters corresponding to a target battery cell of an electronic device and transmitting the current value to the server; receiving an LUT corresponding to the current value of the one or more degradation parameters from the server; and charging the target battery cell based on a charging profile that is generated by charge data of the received LUT.

22 Claims, 8 Drawing Sheets

(52) U.S. Cl.
CPC .............. *G01R 31/396* (2019.01); *H02J 7/40* (2026.01); *H02J 7/933* (2026.01)

(58) Field of Classification Search
CPC ... G01R 31/367; B60L 58/16; B60L 2250/10; B60L 58/18; B60L 53/11; B60L 11/1861; H01M 10/4257; H01M 10/446; H01M 10/0525
USPC ......... 307/9.1, 10.1; 320/116–122, 124, 127, 320/132, 134, 136, 137, 148–152, 161, 320/162
See application file for complete search history.

(56) References Cited

U.S. PATENT DOCUMENTS

| | | | | |
|---|---|---|---|---|
| 2013/0307488 | A1* | 11/2013 | Hwang | H02J 7/005 320/161 |
| 2015/0377976 | A1* | 12/2015 | Maluf | G01R 31/392 702/63 |
| 2016/0214500 | A1* | 7/2016 | Kim | H02J 7/0013 |
| 2016/0363632 | A1* | 12/2016 | Park | G01R 31/3648 |
| 2020/0212684 | A1 | 7/2020 | Campbell et al. | |
| 2021/0135475 | A1* | 5/2021 | Bharathraj | H01M 10/0525 |
| 2021/0268933 | A1* | 9/2021 | Kazuno | B60L 58/16 |
| 2022/0283227 | A1 | 9/2022 | Kim et al. | |
| 2022/0381830 | A1 | 12/2022 | Lim et al. | |

FOREIGN PATENT DOCUMENTS

| | | | |
|---|---|---|---|
| KR | 10-2090476 | B1 | 3/2020 |
| KR | 10-2020-0037592 | A | 4/2020 |
| KR | 10-2021-0149626 | A | 12/2021 |

* cited by examiner

METHOD AND APPARATUS WITH BATTERY CELL CHARGING BASED ON DEGRADATION PARAMETER OF ELECTROCHEMICAL MODEL

CROSS-REFERENCE TO RELATED APPLICATIONS

This application claims the benefit under 35 USC § 119(a) of Korean Patent Application No. 10-2022-0091194, filed on Jul. 22, 2022 in the Korean Intellectual Property Office, the entire disclosure of which is incorporated herein by reference for all purposes.

BACKGROUND

1. Field

The following description relates to a method and apparatus with battery cell charging based on a degradation parameter of an electrochemical model.

2. Description of Related Art

Fast charging of a battery may be used in response to rapid discharging of a battery cell in a high-speed and high-rate driving environment, such as 5G/6G. A constant current-constant voltage (CC-CV) charging method may charge by a constant current until a predetermined voltage and then change by a constant voltage until reaching a preset low current, and a multi-step charging method may charge by a multi-phased constant current from a high current to a low current.

When charging by a constant current, like the CC-CV charging method and the multi-step charging method, in a case where a high current is used to increase a charging speed, degradation of a battery cell may be accelerated when a state of charge (SOC) of the battery cell is high. For example, when the SOC of the battery cell is high, an anode potential may be low, and thus, an internal short may occur or lithium capacity may decrease due to lithium metal deposition on the anode surface.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented method with battery cell charging includes: for each degradation parameter set comprising one or more degradation parameters related to degradation, communicating with a server configured to generate and store a look-up table (LUT) comprising charge data for each index combination of the one or more degradation parameters comprised in the degradation parameter set; determining a current value of the one or more of the degradation parameters corresponding to a target battery cell of an electronic device and transmitting the current value to the server; receiving an LUT corresponding to the current value of the one or more degradation parameters from the server; and charging the target battery cell based on a charging profile that is generated by charge data of the received LUT.

The server may be configured to, before receiving the current value of the one or more degradation parameters corresponding to the target battery cell from the electronic device, generate and store, in advance, an LUT for each combination of an index of the one or more degradation parameters corresponding to the target battery cell.

The transmitting to the server may include: measuring battery information on a current, a voltage, and a temperature of the target battery cell; and determining whether to update a state of health (SOH) of the target battery cell based on the measured battery information.

The determining of whether to update the SOH of the target battery cell may include, in response to a voltage difference between a predicted voltage of the target battery cell based on the measured battery information and a measured voltage of the target battery cell being greater than or equal to a threshold voltage, determining to update the SOH of the target battery cell.

The transmitting to the server further may include, in response to determining to update the SOH of the target battery cell: determining a current SOH of the target battery cell based on the measured battery information and the current value of the one or more degradation parameters determined based on the measured battery information; and determining whether to update an existing LUT based on the determined current SOH of the target battery cell.

The determining of whether to update the existing LUT may include: loading an SOH of the target battery cell at a time point at which the existing LUT is received from the server; determining whether to update the existing LUT based on a difference between the loaded SOH of the target battery cell and the current SOH of the target battery cell; and in response to determining to update the existing LUT, transmitting the current value of the one or more degradation parameters to the server.

The charging of the target battery cell may include generating a charging profile based on an internal state condition for each charging step that is the charge data of the received LUT.

The receiving from the server may include receiving the LUT corresponding to the current value, wherein the LUT corresponding to the current value is output by inputting the current value of the one or more degradation parameters to a machine learning model that is trained by using another LUT and a combination of values of a degradation parameter comprised in the degradation parameter set.

The server may be configured to, for each index combination of a degradation parameter comprised in a degradation parameter set, individually generate and store an LUT for each charging mode, the transmitting to the server may include transmitting the current value of the one or more degradation parameters and a charging mode of the electronic device that is set based on a magnitude of charging power of the electronic device to the server, and the receiving from the server may include receiving the charging mode of the electronic device and an LUT corresponding to the current value of the one or more degradation parameters from the server.

The receiving from the server may include, in response to an LUT corresponding to the current value of the one or more degradation parameters not being stored in the server, receiving, from the server, an LUT determined by combining some of LUTs generated for each index combination of the at least one parameter.

In another general aspect, one or more embodiments include a non-transitory computer-readable storage medium storing instructions that, when executed by one or more processors, configure the one or more processors to perform any one, any combination, or all operations and methods described herein.

In another general aspect, an electronic device includes: for each degradation parameter set comprising one or more degradation parameters related to degradation, a communicator configured to communicate with a server configured to generate and store a look-up table (LUT) comprising charge data for each index combination of the one or more degradation parameters comprised in the degradation parameter set; and a processor configured to: determine and transmit, to the server, a current value of the one or more of the degradation parameters corresponding to a target battery cell of the electronic device; receive an LUT corresponding to the current value of the one or more degradation parameters; and charge the target battery cell based on a charging profile that is generated by charge data of the received LUT.

The communicator may be configured to, before receiving the current value of the one or more degradation parameters corresponding to the target battery cell from the electronic device, communicate with the server configured to generate and store, in advance, an LUT for each combination of an index of the one or more degradation parameters corresponding to the target battery cell.

For the transmitting to the server, the processor may be configured to: measure battery information on a current, a voltage, and a temperature of the target battery cell; and determine whether to update a state of health (SOH) of the target battery cell based on the measured battery information.

For the determining whether to update the SOH of the target battery cell, the processor may be configured to, in response to a voltage difference between a predicted voltage of the target battery cell based on the measured battery information and a measured voltage of the target battery cell being greater than or equal to a threshold voltage, determine to update the SOH of the target battery cell.

For the transmitting to the server, the processor may be configured to, in response to determining to update the SOH of the target battery cell: determine a current SOH of the target battery cell based on the measured battery information and the current value of the one or more degradation parameters determined based on the measured battery information; and determine whether to update an existing LUT based on the determined current SOH of the target battery cell.

For the determining of whether to update the existing LUT, the processor may be configured to: load the SOH of the target battery cell at a time point of receiving the existing LUT from the server; determine whether to update the existing LUT based on a difference between the loaded SOH of the battery cell and the current SOH of the target battery cell; and in response to determining to update the existing LUT, transmit the current value of the one or more degradation parameters to the server.

For the charging of the target battery cell, the processor may be configured to generate a charging profile based on an internal state condition for each charging step that is the charge data of the received LUT.

For the receiving from the server, the processor may be configured to receive the LUT corresponding to the current value, wherein the LUT corresponding to the current value is output by inputting the current value of the one or more degradation parameters to a machine learning model that is trained by using another LUT and a combination of values of a degradation parameter comprised in the degradation parameter set.

The communicator may be configured to, for each index combination of a degradation parameter comprised in a degradation parameter set, communicate with the server configured to individually generate and store an LUT for each charging mode, and the processor may be configured to transmit the current value of the one or more degradation parameters and a charging mode of the electronic device that is set based on a magnitude of charging power of the electronic device to the server, and receive the charging mode of the electronic device and an LUT corresponding to the current value of the one or more degradation parameters from the server.

In another general aspect, a processor-implemented method with battery cell charging includes: transmitting a current value of one or more of degradation parameters corresponding to a target battery cell of an electronic device to a server, in response to determining to update an existing look-up table (LUT) based on a difference between a previous state of health (SOH) of the target battery cell and a current SOH of the target battery cell; receiving an LUT corresponding to the current value of the one or more degradation parameters from the server, wherein the LUT corresponding to the current value may include charge data for an index of the one or more degradation parameters; and charging the target battery cell based on a charging profile that is generated based on the charge data of the LUT corresponding to the current value.

The LUT corresponding to the current value may be generated by the server by: converting the current value of the one or more degradation parameters into one or more indexes of the one or more degradation parameters; and generating the LUT corresponding to the current value based on the one or more indexes.

Other features and aspects will be apparent from the following detailed description, the drawings, and the claims.

Figure 1:
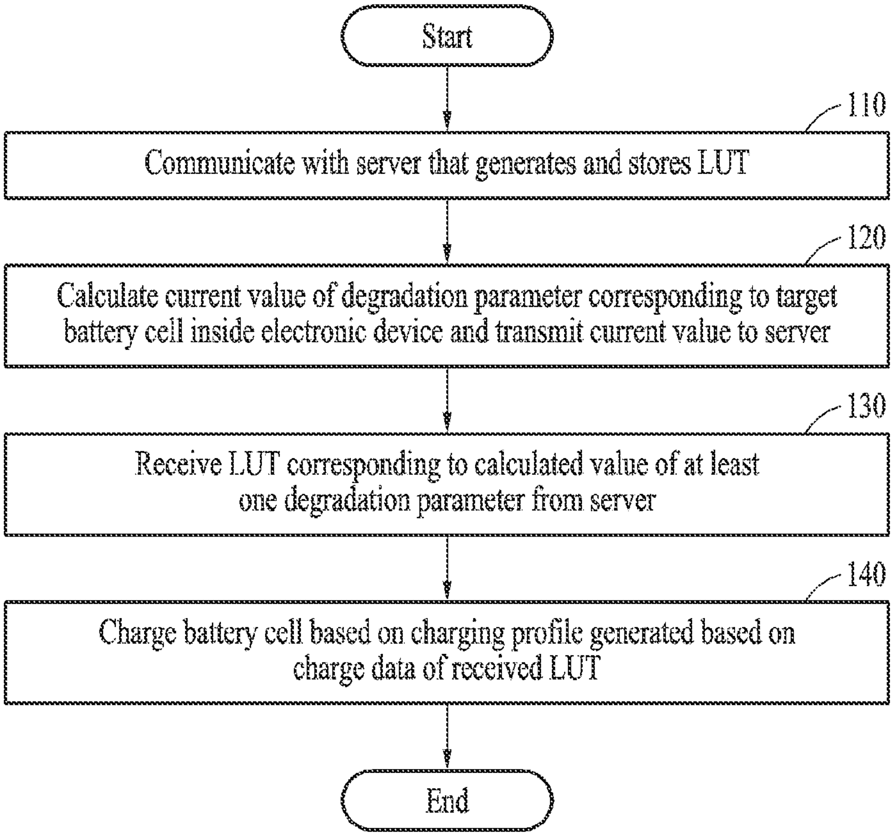
FIG. 1 flowchart schematically illustrating an operation of an electronic device to charge a battery cell according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, devices, and/or systems described herein. However, various changes, modifications, and equivalents of the methods, devices, and/or systems described herein will be apparent after an understanding of the disclosure of this application. For example, the sequences of operations described herein are merely examples, and are not limited to those set forth herein, but may be changed with the exception of operations necessarily occurring in a certain order. Also, descriptions of features that are known after understanding of the disclosure of this application may be omitted for increased clarity and conciseness.

Although terms of "first," "second," and "third" may be used to describe various components, members, regions, layers, or sections, these components, members, regions, layers, or sections are not to be limited by these terms (e.g., "first," "second," and "third"). Rather, these terms are only used to distinguish one component, member, region, layer, or section from another component, member, region, layer, or section. Thus, for example, a "first" component, member, region, layer, or section referred to in examples described herein may also be referred to as a "second" component, member, region, layer, or section, and a "second" component, member, region, layer, or section referred to in examples described herein may also be referred to as the "first" component without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween. Likewise, similar expressions, for example, "between" and "immediately between," and "adjacent to" and "immediately adjacent to," are also to be construed in the same.

The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, components, and/or combinations thereof, but do not preclude the presence or addition of one or more other features, integers, steps, operations, elements, components and/or combinations thereof. As used herein, the term "and/or" includes any one and any combination of any two or more of the associated listed items. The use of the term "may" herein with respect to an example or embodiment (for example, as to what an example or embodiment may include or implement) means that one or more examples or embodiments exists where such a feature is included or implemented, while all examples are not limited thereto.

Unless otherwise defined, all terms, including technical and scientific terms, used herein have the same meaning as commonly understood consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, example embodiments will be described in detail with reference to the accompanying drawings. When describing the embodiments with reference to the accompanying drawings, like reference numerals refer to like elements and a repeated description related thereto will be omitted.

A battery cell may include two electrodes (cathode and anode) for intercalation/deintercalation of lithium-ions (Li+), an electrolyte that is a medium through which lithium-ions (Li+) may move, a separator that physically separates the cathode from the anode to prevent direct flow of electrons but to allow ions to pass therethrough, and a collector that collects electrons generated by an electrochemical reaction and/or provides electrons to be used for the electrochemical reaction. The cathode may include a cathode active material, and the anode may include an anode active material. For example, lithium cobalt oxide ($LiCoO2$) may be used as the cathode active material, and graphite ($C6$) may be used as the anode active material. Lithium-ions (Li+) move from the cathode to the anode while the battery cell is charged, and lithium-ions (Li+) move from the anode to the cathode while the battery cell is discharged. Thus, the concentration of lithium-ions (Li+) in the cathode active material and the concentration of lithium-ions (Li+) in the anode active material may change in response to charging and discharging of the battery cell. To prevent degradation of a battery cell, such as deposition of lithium metal, an electronic device of one or more embodiments may identify a change in an internal state of the battery cell in real-time.

FIG. 1 is a flowchart schematically illustrating an operation of an electronic device to charge a battery cell according to one or more embodiments. Operations 110 through 140 to be described hereinafter may be performed in sequential order, but may not be necessarily performed in sequential order. For example, the operations 110 through 140 may be performed in different orders, and two or more of the operations 110 through 140 may be performed in parallel or simultaneously. Further, one or more of the operations 110 through 140 may be omitted, without departing from the spirit and scope of the shown example. The operations 110 through 140 to be described hereinafter with reference to FIG. 1 may be performed by one or more components of an electronic device (e.g., the electronic device 201 of FIG. 2) described herein.

In operation 110, an electronic device according to one or more embodiments may communicate with a server that generates and stores a look-up table (LUT). For example, the server may be a cloud server. For each parameter set combinable by at least one degradation parameter (e.g., one or more degradation parameters) related to degradation of a battery cell, the server may generate and store an LUT including charge data for each combination of index of the degradation parameter constituting the corresponding degradation parameter set. The degradation parameter may represent a parameter used in an electrochemical model. Not only a single particle model (SPM) but also various application models may be used for the electrochemical model. For example, a degradation parameter corresponding to a lithium-cobalt (LCO)-graphite lithium-ion battery (LIB) battery cell may include three degradation parameters, which are an anode solid electrolyte interphase (SEI) resistance, a cathode capacity, and a balance shift between the cathode and the anode. The degradation parameter of the anode SEI resistance, the degradation parameter of the cathode capacity, and the degradation parameter of the balance shift between the cathode and the anode may constitute one degradation parameter set. Hereinafter, the present disclosure describes that the server mainly generates and stores an LUT including charge data. However, the example is not limited thereto, and an application processor (e.g., one or more processors) in the electronic device may generate and store an LUT instead of the server. In this case, the electronic device may charge a battery cell by receiving the LUT from the application processor without communicating with the server.

In operation 120, the electronic device may calculate (e.g., determine) a current value of at least one degradation parameter corresponding to a target battery cell inside the electronic device and may transmit the current value to the server. For example, the electronic device may transmit a type of the at least one degradation parameter corresponding to the target battery cell and the current value of the at least one degradation parameter to the server.

When the electronic device attempts to charge the target battery cell using an electrochemical model, values of some of the at least one degradation parameter corresponding to the target battery cell may be updated to accurately estimate a degradation state of a battery cell. This is because the degradation state of a battery cell changes over time. When a typical electronic device charges a battery cell with the existing charging profile, instead of a charging profile that reflects the updated value of the degradation parameter, a charging time may increase and degradation per charging time may rapidly progress. The charging profile may represent a policy of providing a charging current and a charging voltage. Accordingly, after updating a degradation parameter value, the electronic device of one or more embodiments may find (e.g., determine) an optimal charging profile that reflects the updated degradation parameter value to effectively charge the battery cell for its charging speed and the battery cell life.

In operation 130, the electronic device may receive, from the server, an LUT corresponding to the current value of the at least one degradation parameter corresponding to the target battery cell. The server may change the current value of the at least one degradation parameter corresponding to the target battery cell that is received from the electronic device to an index corresponding to the current value. The server may find (e.g., determine from among a plurality of LUTs) an LUT corresponding to an index combination of the at least one degradation parameter and may transmit the found LUT to the electronic device.

In operation 140, the electronic device may charge the target battery cell according to a charging profile generated based on charge data of the received LUT.

Figure 2:
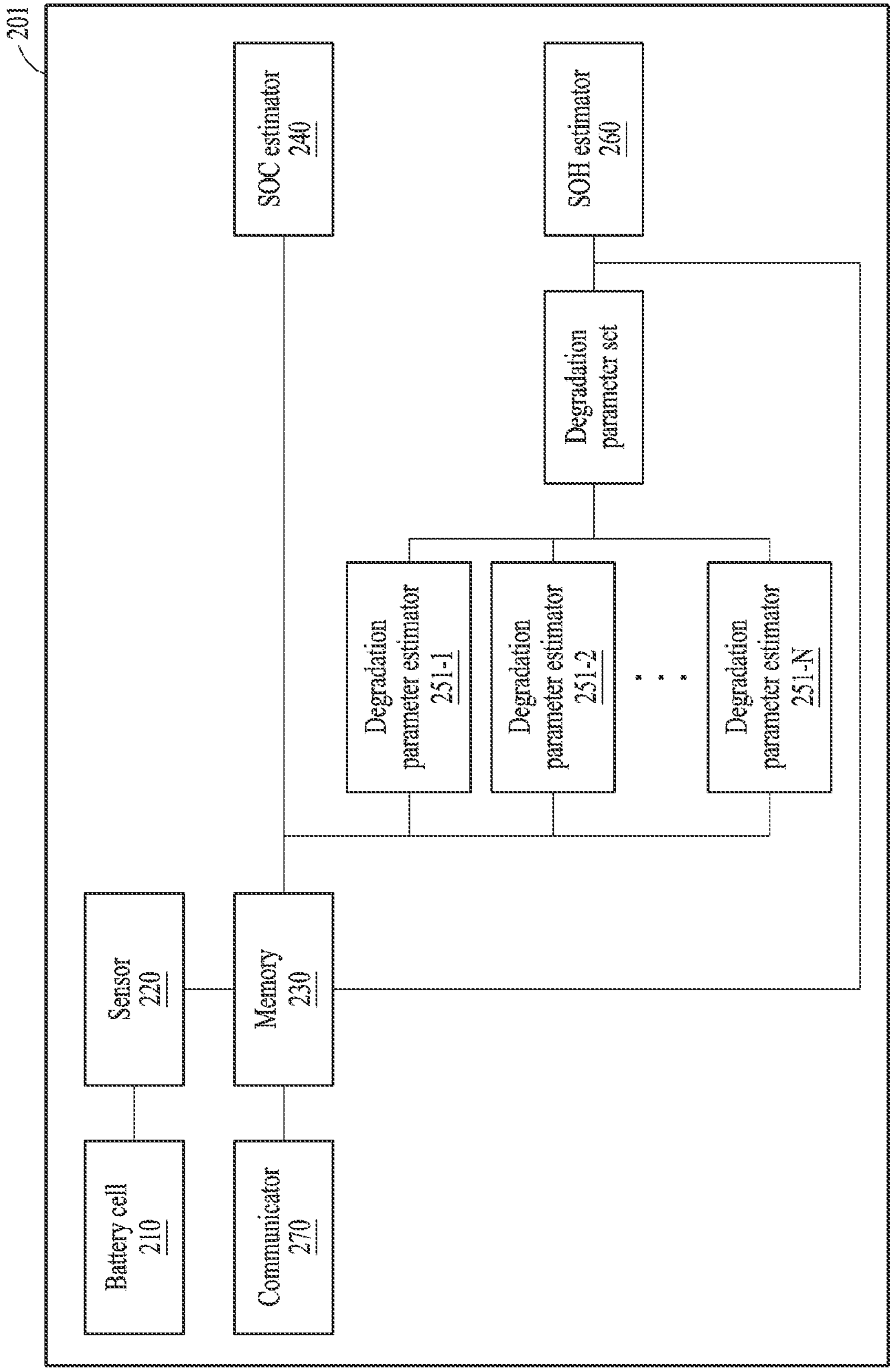
FIG. 2 illustrates an internal structure of an electronic device for estimating an internal state of a battery cell according to one or more embodiments.

FIG. 2 illustrates an internal structure of an electronic device for estimating an internal state of a battery cell according to one or more embodiments.

An electronic device 201 may include a battery cell 210, a sensor 220, a memory 230 (e.g., one or more memories), a state of charge (SOC) estimator 240, degradation parameter estimators 251-1, 251-2, . . . , 251-N, a state of health (SOH) estimator 260, and a communicator 270.

The sensor 220 may obtain battery information of the battery cell 210. Here, the battery information may represent information collectible by the battery cell 210 and may include, for example, a voltage, a current, and/or a temperature of the battery cell 210, which are measured by the sensor 220. The memory 230 may store battery information of the battery cell 210 measured by the sensor 220.

The electronic device 201 may estimate (e.g., determine) an internal state of the battery cell 210, based on the battery information thereof and an electrochemical model. Here, the internal state of the battery cell may include an SOC and/or an SOH of the battery cell.

The SOC estimator 240 may estimate an SOC of the battery cell 210 by using the electrochemical model and the battery information of the battery cell 210. The SOC thereof may represent a degree of a state of charge of the battery cell and may be estimated in a unit of percentage %. For example, an SOC of 0% may represent a fully discharged state and an SOC of 100% may represent a fully charged state. However, such a metric may be variously modified depending on embodiments. Various techniques may be employed for the SOC estimator 240 to estimate the SOC of the battery cell 210. For example, the SOC estimator 240 may estimate the SOC of the battery cell 210 by a current integration method that calculates (e.g., counts) a current flowing into or flowing out of the battery cell 210. The estimated SOC of the battery cell 210 may be stored in the memory 230.

The degradation parameter estimators 251-1, 251-2, . . . , 251-N may calculate a current value of the at least one parameter corresponding to the battery cell 210 based on the measured battery information on the battery cell 210. To predict degradation of the battery cell 210, some of degradation parameters available in the electrochemical model may be used. Depending on a type of battery cell, a degradation parameter used to predict degradation of the battery cell may vary. Hereinafter, a degradation parameter to be used for predicting degradation of the battery cell is described with a degradation parameter corresponding to the battery cell. The at least one degradation parameter corresponding to the battery cell may be predetermined and may be, for example, a first degradation parameter, a second degradation parameter, . . . , an N-th degradation parameter. In this example, N may be an integer greater than or equal to 1. The degradation parameter estimators 251-1, 251-2, . . . , 251-N may calculate at least one degradation parameter value at the current time point by using battery information of the battery cell. For example, the degradation parameter estimator 251-1 may calculate a first degradation parameter value at the current time point by using the battery information of the battery cell 210, the degradation parameter estimator 251-2 may calculate a second degradation parameter value at the current time point by using the battery information of the battery cell 210, and the degradation parameter estimator 251-N may calculate an N-th degradation parameter value at the current time point by using the battery information of the battery cell 210. The first degradation parameter, the second degradation parameter, . . . , the N-th degradation parameter, which are the at least one degradation parameter corresponding to the battery cell 210, may constitute one degradation parameter set. The SOH estimator 260 may estimate the SOH of the battery cell 210, based on the battery information of the battery cell 210 and the current value of the at least one degradation parameter corresponding to the battery cell 210. The SOH of a battery cell may be a capacity state of a battery cell and may represent a quantified battery life. The at least one degradation parameter corresponding to the battery cell 210 may affect the SOH of the battery cell 210. The SOH may be estimated based on the capacity of the battery. The SOH of the battery cell may be expressed by a ratio of the current capacity of the battery cell to an initial capacity of the battery cell. By accurately estimating the SOH, the electronic device 201 of one or more embodiments may be used to determine an appropriate time to replace the battery cell 210 based on the estimated SOH and to notify a user of the appropriate time to replace the battery cell 210. The estimated at least one degradation parameter corresponding to the battery cell 210 and the estimated SOH of the battery cell 210 may be stored in the memory 230.

The communicator 270 may communicate with a server. The communicator 270 may transmit the current value of the at least one degradation parameter corresponding to the battery cell 210 and may receive an LUT corresponding the current value of the at least one degradation parameter from the server.

Figure 3:
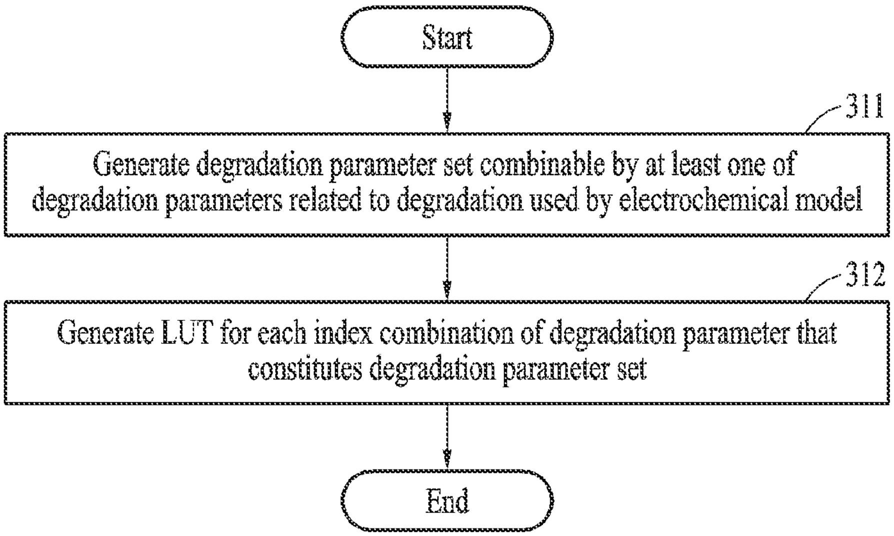
FIG. 3 is a flowchart illustrating an operation of a server to generate and store a look-up table (LUT) including charge data according to one or more embodiments.

FIG. 3 is a flowchart illustrating an operation of a server to generate and store an LUT including charge data according to one or more embodiments.

In operation 311, the server may generate a degradation parameter set combinable by at least one of degradation parameters, which are related to degradation and used by an electrochemical model.

In operation 312, for each generated degradation parameter set, the server may generate and store an LUT including charge data for each index combination of a degradation parameter that constitutes the degradation parameter set. The charge data included in the LUT generated by the server may be charge data for fast charging. According to one or more embodiments, each step of charge data may include a current, a voltage, and an anode potential (e.g., a limit on Li plating generation) According to one or more embodiments, before the server receives the current value of the at least one degradation parameter corresponding to the target battery cell from the electronic device, the server may generate and store, in advance, an LUT for each index combination of the at least one degradation parameter corresponding to the target battery cell.

According to one or more embodiments, for each of the degradation parameters, the server may predetermine a range and the number of indexes that the degradation parameter may have. For example, the server may determine an index of X degradation parameter to be a natural number that is greater than or equal to 1 and less than or equal to K. K may be a natural number greater than or equal to 1. That a degradation parameter has a predetermined index may represent that the degradation parameter is determined to be a value corresponding to the predetermined index. The server may roughly predict a possible range of the degradation parameter value of the battery cell, may assign an index of “1” to the minimum parameter value in the predicted range, and may assign an index of a subsequent order (for example, “2”) to the next parameter value at a predetermined interval.

Figure 4:
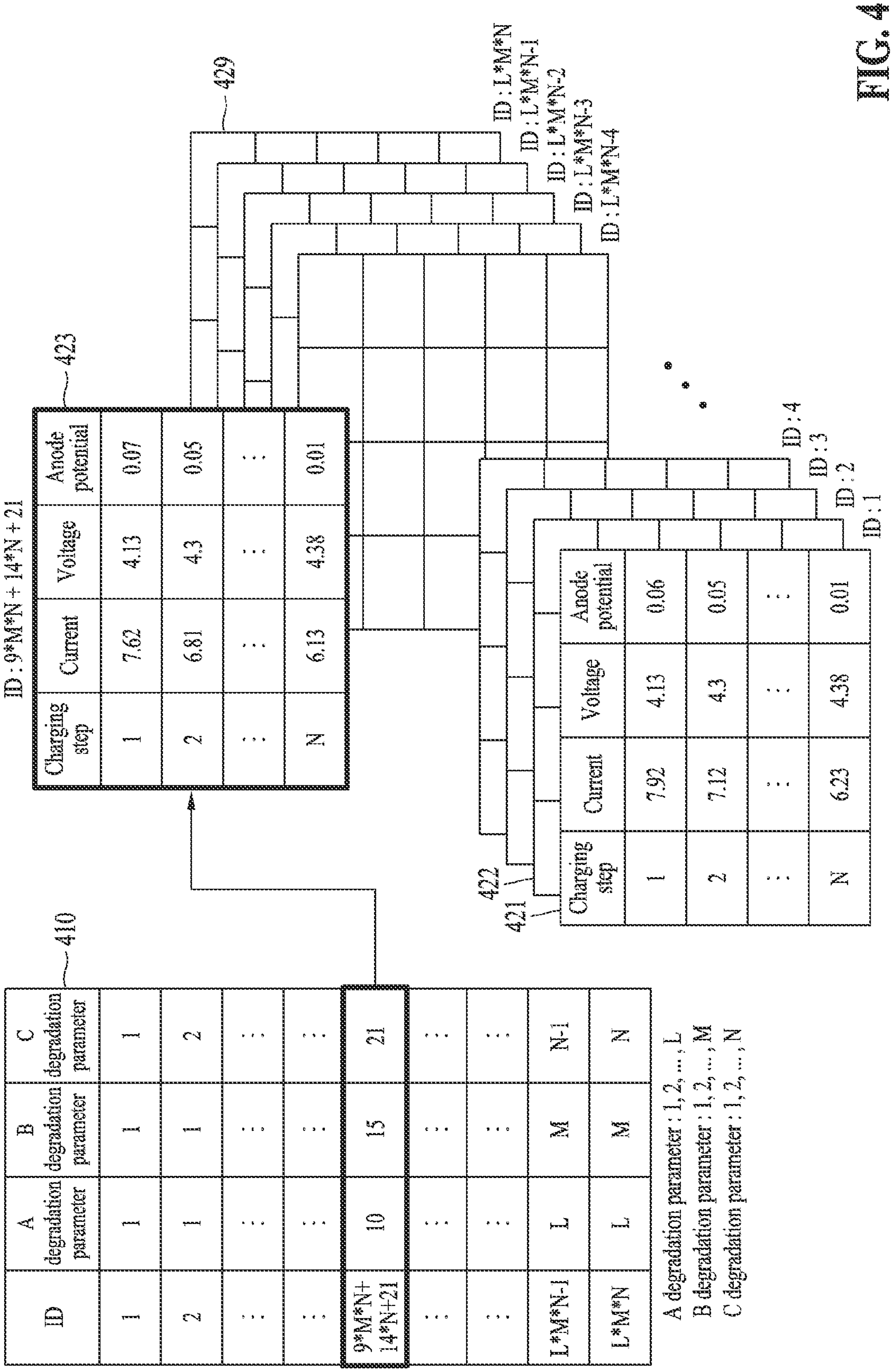
FIG. 4 illustrates an example of an LUT generated and stored by a server according to one or more embodiments.

FIG. 4 illustrates an example of an LUT generated and stored by a server according to one or more embodiments. The server may assign an identification (ID) for each index combination of a degradation parameter that constitutes a degradation parameter set. For a degradation parameter set including A degradation parameter, B degradation parameter, and C degradation parameter, a table 410 may be a table in which an ID is assigned to each index combination of each degradation parameter (A/B/C degradation parameters). For example, A degradation parameter may be set to have an index of natural numbers from 1 to L, B degradation parameter may be set to have an index of natural numbers from 1 to M, and C degradation parameter may be set to have an index of natural numbers from 1 to N. In this example, L, M, and N may be a natural number greater than or equal to 1. For example, the server may assign an ID of “1” to a combination in which A degradation parameter, B degradation parameter, and C degradation parameter have “1”, “1”, “1” indexes, respectively. For example, the server may assign an ID of “9×M×N+14×N+21” to a combination in which A degradation parameter, B degradation parameter, and C degradation parameter have “10”, “15”, “21” indexes, respectively. The server may assign a different ID to each of all combinations of indexes that each of the degradation parameters may have.

The server may generate LUTs 421, 422, 423, . . . , 429 including charge data for each assigned ID to the degradation parameter set. The charge data of the LUT may include an internal state condition for each charging step. In this example, the internal state condition may include an anode potential condition. However, the internal state condition included in the charge data is not limited thereto, and the internal state condition may further include an anode surface lithium ion concentration condition, a cathode surface lithium ion concentration condition, and/or an SOC condition. For example, in a degradation parameter set constituted by A degradation parameter, B degradation parameter, and C degradation parameter, the LUT 423 may be an LUT corresponding to a combination to which an ID of “9×M×N+14×N+21” is assigned among index combinations that the degradation parameters have.

Figure 5:
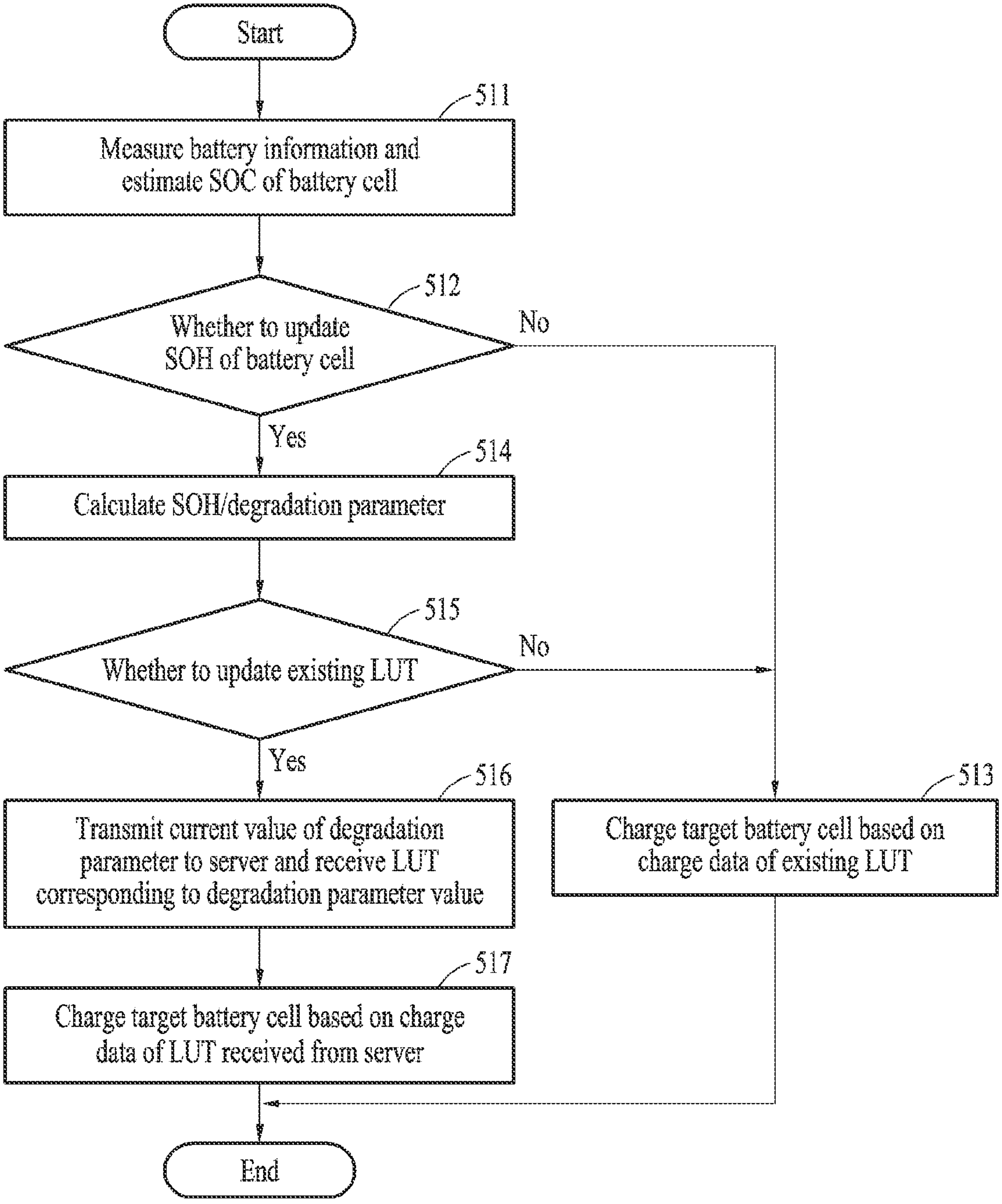
FIG. 5 is a flowchart illustrating an operation of an electronic device to receive a look-up table from a server and charge a target battery cell according to one or more embodiments.

FIG. 5 is a flowchart illustrating an operation of an electronic device to receive an LUT from a server and charge a target battery cell according to one or more embodiments. Operations 511 through 517 to be described hereinafter may be performed in sequential order, but may not be necessarily performed in sequential order. For example, the operations 511 through 517 may be performed in different orders, and at least two of the operations 511 through 517 may be performed in parallel or simultaneously. Further, one or more of operations 511 through 517 may be omitted, without departing from the spirit and scope of the shown example. The operations 511 through 517 to be described hereinafter with reference to FIG. 5 may be performed by one or more components of an electronic device (e.g., the electronic device 201 of FIG. 2) described herein, and in addition to the description of FIG. 5 below, the descriptions of FIGS. 1 through 4 are also applicable to FIG. 5 and are incorporated herein by reference.

In operation 511, the electronic device may measure battery information on a voltage, current, and temperature of a target battery cell (e.g., the battery cell 210 of FIG. 2) and may estimate an SOC of the target battery cell based on the measured battery information of the target battery cell. According to one or more embodiments, the electronic device may periodically accumulate the battery information by measuring the battery information of the target battery cell and may identify a change in the battery information over time. The electronic device may update the SOC of the target battery cell by periodically estimating the SOC of the target battery cell. According to one or more embodiments, operation 511 may be continuously performed regardless of determination by the electronic device to charge the target battery cell.

The electronic device may fast-charge the target battery cell by receiving power from an external power supply device. For example, when the electronic device receives power greater than preset threshold charging power from the external power supply device, the electronic device may determine to fast-charge the target battery cell. Hereinafter, a description of an operation of the electronic device after the electronic device determines to fast-charge the target battery cell is provided.

In operation 512, the electronic device may determine whether to update an SOH of the target battery cell based on the measured battery information. According to one or more embodiments, the electronic device may determine whether to update the SOH of the target battery cell by comparing the measured battery information of the target battery cell with predicted battery information of the target battery cell. For example, the electronic device may predict a voltage of the target battery cell at the current time point based on the current, the temperature, the estimated SOC of the target battery cell, and the existing SOH of the target battery cell included in the battery information of the target battery cell. According to one or more embodiments, in operation 512, when a voltage difference between the predicted voltage of the target battery cell at the current time point based on the measured battery information and the measured voltage of the target battery cell at the current time point is greater than or equal to a threshold voltage, the electronic device may determine to update the SOH of the target battery cell. That is, the electronic device may correct the SOH of the target battery cell such that the SOH of the target battery cell reflects a current degradation state of the target battery cell.

In operation 513, when the electronic device determines not to update the SOH of the target battery cell (e.g., when the voltage difference between the predicted voltage of the target battery cell and the measured voltage of the target battery cell is less than the threshold voltage), the electronic device may charge the target battery cell based on the charge data of the existing LUT. The electronic device may generate a charging profile from the charge data of the existing LUT and may charge the target battery cell based on the generated charging profile. When the electronic device determines not to update the SOH of the target battery cell in operation 513, the electronic device may charge the target battery cell without communicating with a server and without receiving a new LUT from the server.

In operation 514, when the electronic device determines to update the SOH of the target battery cell (e.g., when the voltage difference between the predicted voltage of the target battery cell and the measured voltage of the target battery cell is greater than or equal to the threshold voltage), the electronic device may calculate a current value of at least one degradation parameter corresponding to the target battery cell and an SOH of the target battery cell. For example, after the electronic device calculates the current value of the at least one degradation parameter corresponding to the target battery cell, the electronic device may calculate the SOH of the target battery cell based on the current value of the at least one degradation parameter and the measured battery information of the target battery cell. For example, each degradation parameter estimator of the electronic device may calculate the current value of the at least one degradation parameter corresponding to the target battery cell by using an electrochemical model.

In operation 515, after the electronic device determines to update the SOH of the target battery cell, the electronic device may determine whether to update the existing LUT. According to one or more embodiments, the electronic device may determine whether to update the existing LUT based on a comparison between an SOH of the target battery cell at the current time point and an SOH of the target battery cell at a different time point than the current time point. Here, the existing LUT may be an LUT that the electronic device uses to fast-charge a battery cell, and may be, for example, a latest LUT received from the server based on the current time point.

According to one or more embodiments, the electronic device may load the SOH of the battery cell at the time point at which the electronic device receives the existing LUT from the server. In operation 515, the electronic device may determine whether to update the existing LUT based on a difference between the loaded SOH and the current SOH of the target battery cell. According to one or more embodiments, when the difference between loaded SOH and the current SOH is greater than or equal to a threshold value, the electronic device may determine to update the existing LUT. For example, the threshold value may be 5%, but is not limited thereto. According to one or more embodiments, when a difference between the loaded SOH and the current SOH is greater than or equal to a predetermined ratio of the loaded SOH, the electronic device may determine to update the existing LUT. The predetermined ratio may be 3%, but is not limited thereto.

According to one or more embodiments, when the electronic device determines not to update the existing LUT (e.g., when the difference between loaded SOH and the current SOH is less than the threshold value and/or the difference between the loaded SOH and the current SOH is less than the predetermined ratio of the loaded SOH), according to operation 513, the electronic device may charge the target battery cell with a charging profile based on the charge data of the existing LUT.

In operation 516, when the electronic device determines to update the LUT, the electronic device may transmit the current value of the at least one degradation parameter corresponding to the target battery cell to the server connected to the electronic device and may receive an LUT corresponding to the current value of the at least one degradation parameter from the server. For example, the server may generate and store an LUT including charge data for fast-charging and may find and transmit, to the electronic device, an LUT corresponding to a current value of at least one degradation parameter corresponding to a target battery cell received from the electronic device.

In operation 517, the electronic device may charge the target battery cell based on a charging profile generated based on the charge data of the received LUT from the server. According to one or more embodiments, the electronic device may charge the target battery cell according to the charging profile based on the charge data of the received LUT from the server during a period in which fast-charging is available. For example, the electronic device may charge the target battery cell based on the generated charging profile based on the received LUT from the server while the electronic device receives power greater than the threshold charging power from the external power supply device. The electronic device may not change a charging profile based on an LUT while fast-charging the target battery cell. In addition, for example, after charging the target battery cell is paused as the external power supply device no longer provides charging power, the electronic device may determine whether to receive a new LUT from the server based on operations described above.

According to one or more embodiments, the electronic device may generate a charging profile based on an internal state condition for each charging step that is the charge data of the LUT. The electronic device may determine a charging time for each charging step based on whether the internal state of the battery cell reaches at least one internal state condition for each charging step. For example, a description of an example in which the electronic device receives the LUT 423 of FIG. 4 from the server and generates a charging profile based on charge data included in the LUT 423 is provided. First, the electronic device may charge a target battery cell with a first charging current (e.g., 7.62 A) based on a first charging step and in the first charging step that charges with the first charging current, and when an anode potential of the target battery cell reaches a first anode potential (e.g., 0.07 V), which is an internal state condition, the electronic device may switch from the first charging step to a second charging step. Subsequently, the electronic device may charge the target battery cell with a second charging current (e.g., 6.81 A) based on the second charging step and in the second charging step charges with the second charging current, and when the anode potential of the target battery cell reaches a second anode potential (e.g., 0.05 V), which is the internal state condition, the electronic device may switch from the second charging step to a third charging step. Accordingly, in an example where the electronic device generates a charging profile based on charge data included in an LUT received from a server, in each charging step of the LUT, the electronic device may charge the target battery cell with a charging current of the charging step until an anode potential of the target battery cell reaches an anode potential of the charging step, and the charging steps of the LUT may be sequentially performed.

Figure 6:
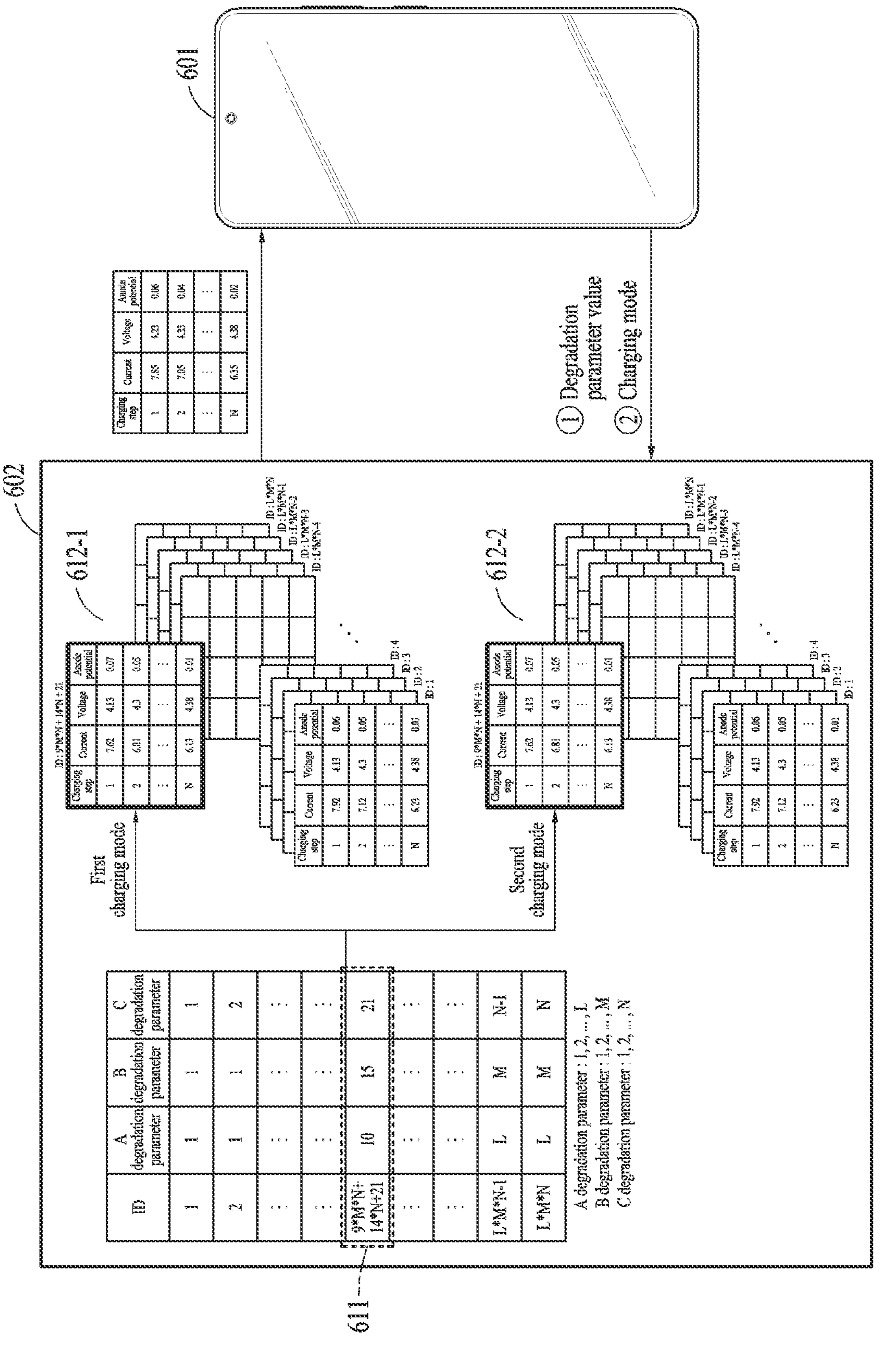
FIG. 6 is a flowchart illustrating an operation of a server to train a machine learning model configured to output an LUT including charge data according to one or more embodiments.

FIG. 6 is a flowchart illustrating an operation of a server to train a machine learning model configured to output an LUT including charge data according to one or more embodiments.

According to one or more embodiments, a server 602 may generate and store an LUT. As described above with reference to FIG. 3, the server 602 may generate degradation parameter sets combinable by at least one of degradation parameters related to degradation and may generate and store an LUT including charge data for each combination of indexes of a degradation parameter constituting a degradation parameter set.

According to one or more embodiments, the server 602 may generate a machine learning model 620 using a combination of values of degradation parameters constituting a degradation parameter set and LUTs. Here, the machine learning model 620 may be at least one model having a machine learning structure configured to extract an LUT in response to an input of a value of a degradation parameter constituting a degradation parameter set and may include, for example, a neural network. For example, output data of the machine learning model 620 may be an LUT including charge data of an internal state condition for each charging step. In addition, the neural network may include a deep neural network (DNN). The DNN may include a fully connected network (FCN), a deep convolutional network (DCN), and/or a recurrent neural network (RNN). The neural network may map to each other input data and output data that are in a non-linear relationship through supervised or unsupervised learning based on deep learning. In the case of supervised learning, the machine learning model 620 described above may be trained based on training data including a pair of a training input and a training output mapped to the training input.

According to one or more embodiments, training input data may be a combination of values of degradation parameters constituting a degradation parameter set. For example, the server 602 may convert an index of each degradation parameter constituting the degradation parameter set into its corresponding degradation parameter value and may use a combination of the degradation parameter value as training input data. Training output data may be an LUT that is generated corresponding to a combination of indexes of each degradation parameter constituting the degradation parameter set. For example, referring to FIG. 6, with respect to a combination 611 of indexes of degradation parameters constituting a degradation parameter set, an index "1" of A degradation parameter, an index "1" of B degradation parameter, and an index "1" of C degradation parameter may be converted into respective parameter values and a combination of each degradation parameter value may be used as training input data, and an LUT 612 may be used as training output data. The machine learning model 620 may be trained to output a training output from a training input. The machine learning model 620 in training may generate a temporary output in response to the training input and may be trained to minimize a loss between the temporary output and a training output (e.g., a ground truth value). During the training process, a parameter (e.g., a connection weight between nodes and layers in the neural network) of the machine learning model 620 may be updated based on the loss.

According to one or more embodiments, the server 602 may receive a calculated value for at least one degradation parameter corresponding to the target battery cell from the electronic device and may output an LUT by inputting the calculated value for the at least one degradation parameter to the machine learning model 620. The server 602 may transmit the output LUT to the electronic device. The electronic device may receive the output LUT from the machine learning model 620 and may charge the target battery cell by generating a charging profile based on the received LUT.

Figure 7:
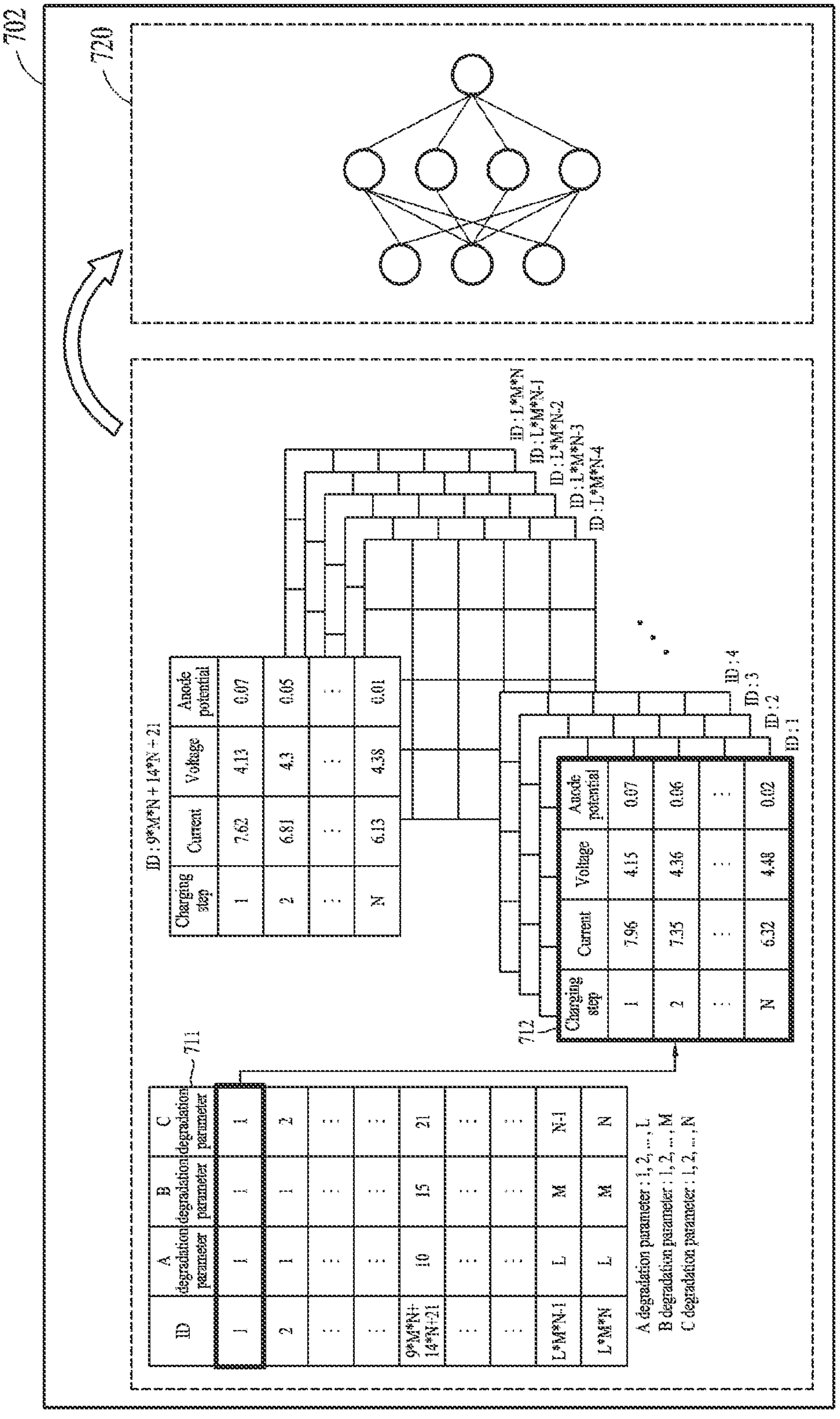
FIG. 7 illustrates an operation of an electronic device to receive an LUT corresponding to a charging mode of the electronic device from a server according to one or more embodiments.

FIG. 7 illustrates an operation of an electronic device to receive an LUT corresponding to a charging mode of the electronic device from a server according to one or more embodiments.

According to one or more embodiments, for each degradation parameter set, a server 702 may individually generate and store an LUT for each charging mode for each combination of indexes of degradation parameters constituting the degradation parameter set. The server 702 may calculate, for each charging mode, an LUT including optimal charge data by using different electrochemical models for each charging mode. Even when index combinations of degradation parameters constituting a degradation parameter set are the same, the server may generate an LUT corresponding to the index combination for each charging mode. As illustrated in FIG. 7, a first charging mode and a second charging mode may be present. However, the example is not limited thereto, and 3 or more charging modes may be present. In this case, for each of the first charging mode and the second charging mode, the server 702 may generate and store, in advance, an LUT for each index combination that at least one degradation parameter corresponding to the target battery cell has. For a combination 711 in which A degradation parameter, B degradation parameter, and C degradation parameter have indexes of "10", "15", and "21", respectively, the server 702 may individually generate and store an LUT 712-1 for the first charging mode and an LUT 712-2 for the second charging mode.

According to one or more embodiments, an electronic device 701 may transmit the charging mode of the electronic device 701 to the server 702 while transmitting a current value of the at least one degradation parameter corresponding to the target battery cell to the server 702. For example, the electronic device 701 may set the charging mode based on the magnitude of charging power provided by an external power supply device. When the electronic device 701 receives charging power greater than or equal to 25 W and less than or equal to 45 W, the electronic device 701 may set the charging mode to a first charging mode (e.g., a fast charging mode). When the electronic device 701 receives charging power greater than or equal to 45 W, the electronic device 701 may set the charging mode to a second charging mode (e.g., an ultra-fast charging mode). According to one or more embodiments, the electronic device 701 may receive, from the server 702, an LUT corresponding to the charging mode of the electronic device 701 and the current value of the at least one degradation parameter corresponding to the target battery cell.

Furthermore, when the electronic device transmits the current value of the at least one degradation parameter corresponding to the target battery cell to the server, the LUT corresponding to the current value of the at least one degradation parameter may not be generated and stored in the server in advance. For example, when too many LUTs are required to individually generate LUTs corresponding to all possible values of each degradation parameter constituting a degradation parameter set, the number of indexes of each degradation parameter may be limited in the server, and thus, an index corresponding to the current value of the degradation parameter may not be predefined in the server. In this case, the electronic device may receive, from the server, an LUT calculated by combining some of LUTs generated for each index combination of the at least one degradation parameter corresponding to the target battery cell.

According to one or more embodiments, the server may convert the current value of the at least one degradation parameter corresponding to the target battery cell into an index of each degradation parameter. When a converted index for a first degradation parameter coincides with one of predefined indexes for the first degradation parameter in the server, the server may designate the converted index for the first degradation parameter to an index corresponding to the first degradation parameter. On the other hand, when a converted index for a second degradation parameter does not coincide with predefined indexes for the second degradation parameter in the server, the server may designate two indexes that are the closest to the converted index for the second degradation parameter among the predefined indexes for the second degradation parameter in the server to the indexes corresponding to the second degradation parameter. For example, when natural number indexes from 1 to 30 are defined for the second degradation parameter in the server and a converted index for the second degradation parameter is 2.4, the index of "2" and the index of "3" may be designated to the index corresponding to the second degradation parameter. The server may generate all possible index combinations that may be generated by using at least one index corresponding to each of the at least one degradation parameter corresponding to the target battery cell and may calculate an LUT corresponding to the target battery cell by combining LUTs corresponding to each of the index combinations. According to one or more embodiments, the server may calculate LUTs corresponding to the target battery cell by assigning a weight to each LUT corresponding to each of the index combinations. For example, in an example, at least one degradation parameter corresponding to the target battery cell is A degradation parameter and B degradation parameter, an index corresponding to A degradation parameter is "3.4", and an index corresponding to B degradation parameter is "10.2". In this example, the server may calculate an LUT corresponding to the target battery cell by combining four LUTs, which are an LUT corresponding to a combination in which indexes of A degradation parameter and B degradation parameter are "3" and "10", respectively, an LUT corresponding to a combination in which indexes of A degradation parameter and B degradation parameter are "3" and "11", respectively, an LUT corresponding to a combination in which indexes of A degradation parameter and B degradation parameter are "4" and "10", respectively, and an LUT corresponding to a combination in which indexes of A degradation parameter and B degradation parameter are "4" and "11", respectively, and may transmit the calculated LUT to the electronic device.

Figure 8:
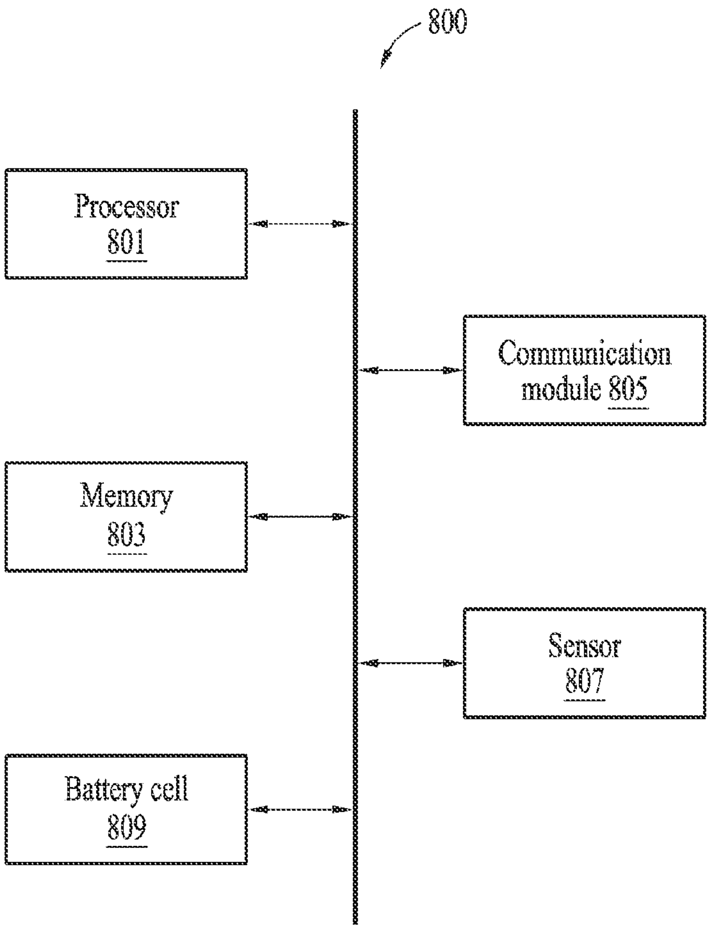
FIG. 8 illustrates an electronic device according to one or more embodiments.

FIG. 8 illustrates an electronic device according to one or more embodiments.

Referring to FIG. 8, an electronic device 800 (e.g., an electronic apparatus) includes a processor 801 (e.g., one or more processors), a memory 803 (e.g., one or more memories), a communication module 805, a sensor 807 (e.g., one or more sensors), and a battery cell 809. The electronic device 800 may include an apparatus configured to perform any one, any combination of any two or more of, or all operations described above with reference to FIGS. 1 to 7. For example, the electronic device 800 may include a user device, such as, for example, a smartphone, a personal computer, and a tablet PC, augmented reality (AR) glasses, a sensor, and a server. The electronic device 800 may be or include the electronic device 201 of FIG. 2 and/or the electronic device 701 of FIG. 7.

In an example, the processor 801 may perform any one of, any combination of any two or more of, or all operations described above with reference to FIGS. 1 to 7. For example, the processor 801 may include the SOC estimator 240, the SOH estimator 260, and the degradation parameter estimators 251-1, 251-2, . . . , 251-N of FIG. 2.

The memory 803 may be a volatile memory or a non-volatile memory, and may store data related to methods and operations described above with reference to FIGS. 1 to 7. The memory 803 may include, for example, a random-access memory (RAM), a dynamic RAM (DRAM), a static RAM (SRAM), and/or other types of nonvolatile memory that are known in the related technical field. The memory 803 may be or include the memory 230 of FIG. 2.

The electronic device 800 according to an aspect may connect to an external apparatus, for example, a server (e.g., the server 602 of FIG. 6), through a communication module 805 and may exchange data therethrough.

In an example, the memory 803 may store a program or instructions for which the methods and operations described above with reference to FIGS. 1 to 7 are implemented. The processor 801 may execute the program or instructions stored in the memory 803 and may control the electronic device 800. A code of the program executed by the processor 801 may be stored in the memory 803. The memory 803 may store instructions that, when executed by the processor 801, configure the processor 801 to perform any one, any combination of any two or more of, or all operations described above with respect to FIGS. 1 to 7.

The sensor 807 may be or include an image capturing sensor and may be or include the sensor 220 of FIG. 2. The battery cell 809 may be or include the battery cell 210 of FIG. 2. The communication module 805 may be or include the communicator 270 of FIG. 2.

In an example, the electronic device 800 may further include other components not illustrated herein. For example, the electronic device 800 may further include an input/output (I/O) interface that includes an input device and an output device as a method for interfacing with the communication module 805. As another example, the electronic device 800 may further include other components, such as a transceiver, a variety of sensors (e.g., in addition to the sensor 807), and a database.

The electronic devices, battery cells, sensors, memories, SOC estimators, degradation parameter estimators, SOH estimators, servers, processors, communication modules, communicators, electronic device 201, battery cell 210, sensor 220, memory 230, SOC estimator 240, degradation parameter estimators 251-1, 251-2, . . . , 251-N, SOH estimator 260, communicator 270, server 602, electronic device 701, server 702, electronic device 800, processor 801, memory 803, communication module 805, sensor 807, server 809, battery cell 810, and other apparatuses, units, modules, devices, and components described herein with respect to FIGS. 1-8 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-8 perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method implemented by a processor, the method comprising:

for at least one degradation parameter set including a plurality of degradation parameters related to degradation, communicating with a server configured to generate and store a look-up table (LUT) including charge data for at least one index combination of the plurality of degradation parameters included in the at least one degradation parameter set;

determining a present value of one or more of the plurality of degradation parameters corresponding to a target battery cell of an electronic device and transmitting the present value to the server;

receiving the LUT corresponding to the present value of the one or more of the plurality of degradation parameters from the server; and charging the target battery cell based on a charging profile that is generated based on the charge data of the received LUT, wherein the method further comprises, before the transmitting the present value to the server:

determining a current SOH of the target battery cell based on the present value of the one or more of the plurality of degradation parameters, the present value of the one or more of the plurality of degradation parameters determined based on battery information; and determining whether to update an existing LUT based on the determined current SOH of the target battery cell.

2. The method of claim 1, wherein the server is configured to, before receiving the present value of the one or more of the plurality of degradation parameters corresponding to the target battery cell from the electronic device, generate and store, in advance, the LUT for at least one combination of an index of the plurality of degradation parameters corresponding to the target battery cell.

3. The method of claim 1, wherein the method further comprises, before the transmitting the present value to the server:

measuring the battery information, the battery information including a current, a voltage, and a temperature of the target battery cell; and determining whether to update a state of health (SOH) of the target battery cell based on the measured battery information.

4. The method of claim 3, wherein the determining of whether to update the SOH of the target battery cell comprises, based on a voltage difference between a predicted voltage of the target battery cell based on the measured battery information and a measured voltage of the target battery cell being greater than or equal to a threshold voltage, determining to update the SOH of the target battery cell.

5. The method of claim 4, wherein the determining the current SOH and the determining whether to update the existing LUT are performed in response to the determining to update the SOH of the target battery cell.

6. The method of claim 5, wherein the determining of whether to update the existing LUT comprises:

loading an SOH of the target battery cell at a time point at which the existing LUT is received from the server;

determining whether to update the existing LUT based on a difference between the loaded SOH of the target battery cell and the current SOH of the target battery cell; and based on determining to update the existing LUT, transmitting the present value of the one or more of the plurality of degradation parameters to the server.

7. The method of claim 1, wherein the charging of the target battery cell comprises generating the charging profile based on an internal state condition for each charging step that is the charge data of the received LUT.

8. The method of claim 1, wherein the receiving from the server comprises receiving the LUT corresponding to the present value, wherein the LUT corresponding to the present value is output by inputting the present value of the one or more of the plurality of degradation parameters to a machine learning model that is trained by using another LUT and a value of a degradation parameter included in the at least one degradation parameter set.

9. The method of claim 1, wherein the server is configured to, for the at least one index combination of a degradation parameter included in a degradation parameter set, individually generate and store a LUT for each charging mode, the transmitting to the server comprises transmitting the present value of the one or more of the plurality of degradation parameters and a charging mode of the electronic device that is set based on a magnitude of charging power of the electronic device to the server, and the receiving from the server comprises receiving the charging mode of the electronic device and the LUT corresponding to the present value of the one or more of the plurality of degradation parameters from the server.

10. The method of claim 1, wherein the receiving from the server comprises, based on the LUT corresponding to the present value of the one or more of the plurality of degradation parameters not being stored in the server, receiving, from the server, a LUT determined by combining some of LUTs generated for the at least one index combination of the plurality of degradation parameters.

11. A non-transitory computer-readable storage medium storing instructions that, when executed by a processor, configure the processor to perform the method of claim 1.

12. An electronic device comprising:

a communicator configured to, for at least one degradation parameter set including a plurality of degradation parameters related to degradation, communicate with a server configured to generate and store a look-up table (LUT) comprising charge data for at least one index combination of the plurality of degradation parameters comprised in the at least one degradation parameter set; and a processor configured to:

determine and transmit, to the server, a present value of one or more of the plurality of degradation parameters corresponding to a target battery cell of the electronic device;

receive the LUT corresponding to the present value of the one or more of the plurality of degradation parameters; and charge the target battery cell based on a charging profile that is generated based on the charge data of the received LUT;

determine a current SOH of the target battery cell based on the present value of the one or more of the plurality of degradation parameters, the present value of the one or more of the plurality of degradation parameters determined based on battery information; and determine whether to update an existing LUT based on the determined current SOH of the target battery cell.

13. The electronic device of claim 12, wherein the communicator is configured to, before receiving the present value of the one or more of the plurality of degradation parameters corresponding to the target battery cell from the electronic device, communicate with the server configured to generate and store, in advance, the LUT for each combination of an index of the one or more of the plurality of degradation parameters corresponding to the target battery cell.

14. The electronic device of claim 12, wherein, for the transmitting to the server, the processor is configured to:

measure the battery information, the battery information including a current, a voltage, and a temperature of the target battery cell; and determine whether to update a state of health (SOH) of the target battery cell based on the measured battery information.

15. The electronic device of claim 14, wherein, for the determining whether to update the SOH of the target battery cell, the processor is configured to, based on a voltage difference between a predicted voltage of the target battery cell based on the measured battery information and a measured voltage of the target battery cell being greater than or equal to a threshold voltage, determine to update the SOH of the target battery cell.

16. The electronic device of claim 15, wherein, for the transmitting to the server, the processor is configured to, based on determining to update the SOH of the target battery cell:

determine the current SOH of the target battery cell based on the present value of the one or more of the plurality of degradation parameters; and determine whether to update the existing LUT based on the determined current SOH of the target battery cell.

17. The electronic device of claim 16, wherein, for the determining of whether to update the existing LUT, the processor is configured to:

load the SOH of the target battery cell at a time point of receiving the existing LUT from the server;

determine whether to update the existing LUT based on a difference between the loaded SOH of the target battery cell and the current SOH of the target battery cell; and based on determining to update the existing LUT, transmit the present value of the one or more of the plurality of degradation parameters to the server.

18. The electronic device of claim 12, wherein, for the charging of the target battery cell, the processor is configured to generate the charging profile based on an internal state condition for each charging step that is the charge data of the received LUT.

19. The electronic device of claim 12, wherein, for the receiving from the server, the processor is configured to receive the LUT corresponding to the present value, wherein the LUT corresponding to the present value is output by inputting the present value of the one or more of the plurality of degradation parameters to a machine learning model that is trained by using another LUT and a combination of values of a degradation parameter comprised in the at least one degradation parameter set.

20. The electronic device of claim 12, wherein the communicator is configured to, for at least one index combination of a plurality of degradation parameters comprised in a degradation parameter set, communicate with the server configured to individually generate and store a LUT for each charging mode, and the processor is configured to transmit the present value of the one or more of the plurality of degradation parameters and a charging mode of the electronic device that is set based on a magnitude of charging power of the electronic device to the server, and receive the charging mode of the electronic device and the LUT corresponding to the present value of the one or more of the plurality of degradation parameters from the server.

21. A method implemented by a processor, the method comprising:

transmitting a present value of one or more degradation parameters corresponding to a target battery cell of an electronic device to a server, based on determining to update an existing look-up table (LUT) based on a difference between a previous state of health (SOH) of the target battery cell and a current SOH of the target battery cell;

receiving the LUT corresponding to the present value of the one or more degradation parameters from the server, wherein the LUT corresponding to the present value includes charge data for an index of the one or more degradation parameters; and charging the target battery cell based on a charging profile that is generated based on the charge data of the LUT corresponding to the present value.

22. The method of claim 21, wherein the LUT corresponding to the present value is generated by the server by:

converting the present value of the one or more degradation parameters into one or more indexes of the one or more degradation parameters; and generating the LUT corresponding to the present value based on the one or more indexes.

* * * * *